(12) United States Patent
Lee et al.

(10) Patent No.: US 8,999,787 B2
(45) Date of Patent: Apr. 7, 2015

(54) SEMICONDUCTOR DEVICE

(71) Applicant: SK Hynix Inc., Icheon-si Gyeonggi-do (KR)

(72) Inventors: Ki Hong Lee, Suwon-si (KR); Seung Ho Pyi, Seongnam-si (KR); Seok Min Jeon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/471,850

(22) Filed: Aug. 28, 2014

(65) Prior Publication Data

US 2014/0370675 A1 Dec. 18, 2014

Related U.S. Application Data

(62) Division of application No. 13/942,133, filed on Jul. 15, 2013, now Pat. No. 8,847,304.

(30) Foreign Application Priority Data

Mar. 26, 2013 (KR) .................. 10-2013-0032370

(51) Int. Cl.
*H01L 21/02* (2006.01)
*H01L 27/115* (2006.01)

(52) U.S. Cl.
CPC ...... *H01L 27/11578* (2013.01); *H01L 21/0223* (2013.01)

(58) Field of Classification Search
CPC .............. H01L 21/76898; H01L 27/11582; H01L 27/11578; H01L 27/11556; H01L 29/792; H01L 29/66833; H01L 29/78642
USPC ............... 438/264–268, 424, 591, 761; 257/E21.158, 591, 645, 29.255
See application file for complete search history.

(56) References Cited

U.S. PATENT DOCUMENTS

2012/0052674 A1* 3/2012 Lee et al. ............ 438/591
2012/0098051 A1* 4/2012 Son et al. ............ 257/324
2012/0295409 A1* 11/2012 Yun et al. ........... 438/268

* cited by examiner

*Primary Examiner* — Michael Lebentritt
(74) *Attorney, Agent, or Firm* — William Park & Associates Patent Ltd.

(57) ABSTRACT

A semiconductor device includes a plurality of conductive layers and a plurality of insulating layers formed alternately with each other, at least one channel layer passing through the plurality of conductive layers and the plurality of insulating layers, and at least one first charge blocking layer surrounding the at least one channel layer, wherein a plurality of first regions, interposed between the at least one channel layer and the plurality of conductive layers, and a plurality of second regions, interposed between the at least one channel layer and the plurality of insulating layers, are alternately defined on the at least one first charge blocking layer, and each of the plurality of first regions has a greater thickness than each of the plurality of second regions.

11 Claims, 9 Drawing Sheets

SEMICONDUCTOR DEVICE

CROSS-REFERENCE TO RELATED APPLICATION

The present application claims priority to Korean patent application number 10-2013-0032370 filed on Mar. 26, 2013, in the Korean Intellectual Property Office, the entire disclosure of which is incorporated by reference herein.

BACKGROUND

1. Technical Field

Various embodiments relate generally to a semiconductor device and, more particularly, to a three-dimensional semiconductor device.

2. Related Art

Non-volatile memory devices can retain the stored data regardless of power on/off conditions. As memory devices having memory cells fabricated in the form of a single layer on silicon substrates have reached physical limits in increasing the degree of integration, there are proposals of three-dimensional (3D) structured non-volatile memory devices that have memory cells vertically stacked on silicon substrates.

A 3D non-volatile memory device may include interlayer insulating layers and word lines stacked alternately with each other and channel layers penetrating therethrough. In addition, memory cells may be stacked along the channel layers. The degree of integration of the 3D non-volatile memory device having the above-described configuration may be improved by arranging strings in a U shape.

However, since the stacked memory cells are formed at the same time, there is a limit in increasing the thickness of the stacked word lines. Therefore, each of the word lines may have a high resistance. In addition, since a memory layer of the memory cells and a gate insulating layer of a pipe transistor include the same materials, the gate insulating layer may not be thick enough. Therefore, a threshold voltage of the pipe transistor may vary. As a result, it may be difficult to ensure characteristics of the 3D non-volatile memory device.

SUMMARY

Various embodiments relate to a semiconductor device having improved device characteristics.

A semiconductor device according to an embodiment of the present invention may include a plurality of conductive layers and a plurality of insulating layers formed alternately with each other, at least one channel layer passing through the plurality of conductive layers and the plurality of insulating layers, and at least one first charge blocking layer surrounding the at least one channel layer, wherein a plurality of first regions, interposed between the at least one channel layer and the plurality of conductive layers, and a plurality of second regions, interposed between the at least one channel layer and the plurality of insulating layers, are alternately defined on the at least one first charge blocking layer, and each of the plurality of first regions has a greater thickness than each of the plurality of second regions.

A semiconductor device according to an embodiment of the present invention may include a plurality of conductive layers and a plurality of insulating layers formed alternately with each other, at least one channel layer passing through the plurality of conductive layers and the plurality of insulating layers, and a charge blocking layer surrounding the at least one channel layer and including one or more protrusions formed on a surface contacting the plurality of conductive layers.

DETAILED DESCRIPTION

Hereinafter, various embodiments of the present disclosure will be described in detail with reference to the accompanying drawings. In the drawings, thickness and distance of components are exaggerated compared to the actual physical thickness and distance of intervals for the convenience of illustration. In the following description, a detailed explanation of known-related functions and constitutions may be omitted to avoid unnecessarily obscuring the subject manner of the present invention.

Figure 1A:
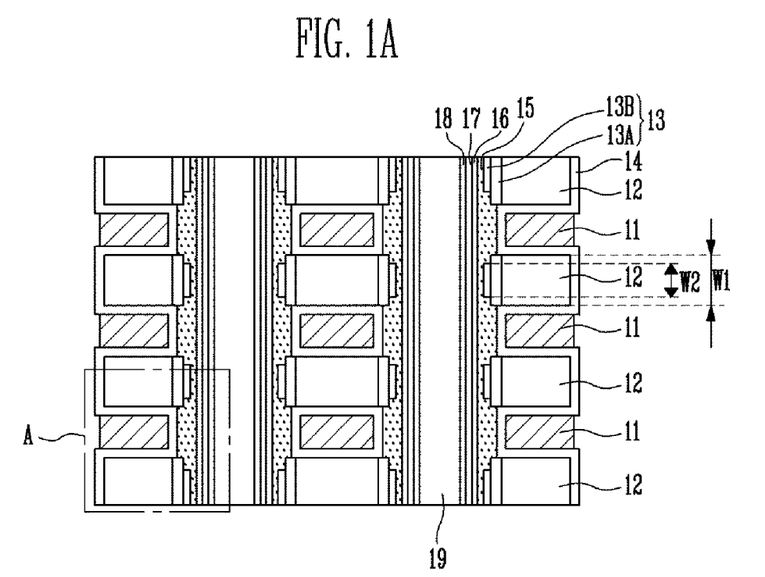
FIG. 1A is a cross-sectional view of the structure of a semiconductor device according to an embodiment of the present invention.
Figure 1B:
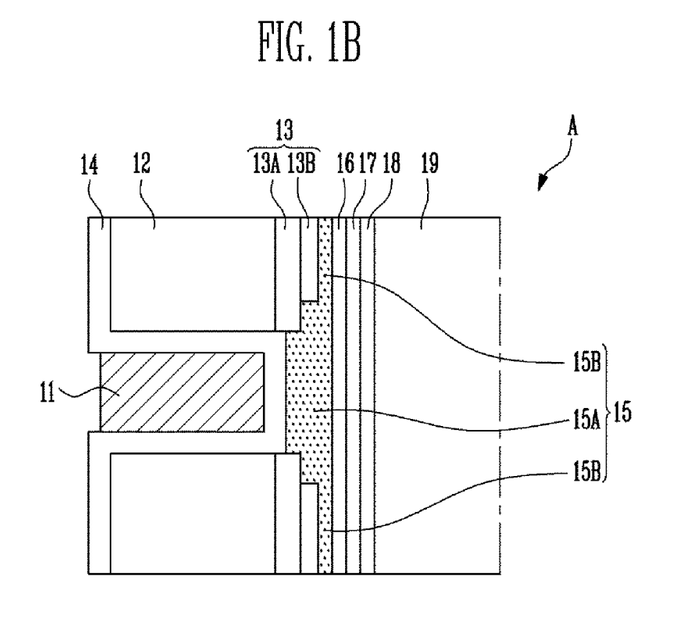
FIG. 1B is an enlarged view of a region A of FIG. 1A.

FIG. 1A is a cross-sectional view of the structure of a semiconductor device according to an embodiment of the present invention. FIG. 1B is an enlarged view of a region A.

As illustrated in FIGS. 1A and 1B, a semiconductor device according to an embodiment of the present invention may include a plurality of conductive layers 11, a plurality of insulating layers 12, at least one channel layer 18 and at least one first charge blocking layer 15.

The plurality of conductive layers 11 and the plurality of insulating layers 12 may be formed alternately with each other. The conductive layers 11 may have the same or different thicknesses. For example, at least one uppermost conductive layer 11 may have a greater thickness than the rest of the conductive layers 11. Alternatively, at least one uppermost conductive layer 11 and at least one lowermost conductive layer 11 may each have a greater thickness than the other conductive layers 11. In addition, the conductive layers 11 may include at least one of a polysilicon layer, a silicide layer or a metal layer.

The channel layer 18 may pass through the plurality of conductive layers 11 and the plurality of insulating layers 12. For example, the channel layer 18 may have various shapes such as a straight shape, a U-shape and a W-shape. In addition, the channel layer 18 may be formed in a tubular shape manner having an open central portion, in a pillar shape manner having a central portion completely filled, or a combination thereof. When the channel layer 18 is formed in the tubular shape, the central portion of the tubular shape may be filled with an insulating layer 19.

The first charge blocking layer 15 may surround the channel layer 18. A plurality of first regions 15A and a plurality of second regions 15B may be alternately defined on the first charge blocking layer 15. The first regions 15A may be interposed between the channel layer 18 and the plurality of conductive layers 11. The plurality of second regions 15B may be interposed between the channel layer 18 and the plurality of insulating layers 12. In addition, each of the first regions 15A of the first charge blocking layer 15 may have a greater thickness than each of the second regions 15B. The first charge blocking layer 15 may have unevenness on an inner surface or an outer surface thereof. For example, the first charge blocking layer 15 may include protrusions formed on portions of the outer surface in contact with the conductive layers 11.

The semiconductor device may further include at least one of sacrificial patterns 13, a data storage layer 16, a tunnel insulating layer 17 and a second charge blocking layer 14.

The sacrificial patterns 13 may surround the plurality of second regions 15B of the first charge blocking layer 15. For example, the sacrificial patterns 13 may surround the outer surface of the first charge blocking layer 15 except for the protrusions.

Each of the sacrificial patterns 13 may include a single layer structure or a multilayer structure. For example, the sacrificial patterns 13 may include first dielectric patterns 13A surrounding the first charge blocking layer 15 and second dielectric patterns 13B interposed between the first charge blocking layer 15 and the first dielectric patterns 13A. Each of the first dielectric patterns 13A may include an oxide layer, and each of the second dielectric patterns 13B may include a nitride layer. In addition, a width W1 of first dielectric pattern 13A may be the same as a width W2 of the second dielectric pattern 13B. In other words, the first dielectric pattern 13A and the second dielectric pattern 13B may have the same width (W1=W2) or different widths. For example, the width W1 of the first dielectric pattern 13A may be greater than the width W2 of the second dielectric pattern 13B (W1>W2).

In addition, the semiconductor device may further include the second charge blocking layer 14. The second charge blocking layer 14 may be interposed between the first regions 15A of the first charge blocking layer 15 and the plurality of conductive layers 11. The second charge blocking layer 14 may also be interposed between the conductive layers 11 and the insulating layers 12. The second charge blocking layer 14 may surround the conductive layers 11.

According to the above-described structure of the semiconductor device, the thickness of the first charge blocking layer 15 may be selectively increased in areas where memory cells are formed. Therefore, each of the memory cells may include the charge blocking layer having a sufficient thickness. In addition, the formation of the second charge blocking layer 14 may be omitted, so that the thickness of the conductive layers 11 may be increased. Therefore, the resistance of word lines or selection gates may be reduced.

FIGS. 2A to 2E are cross-sectional views illustrating a process flow for a method of manufacturing a semiconductor device according to an embodiment of the present invention.

Figure 2A:
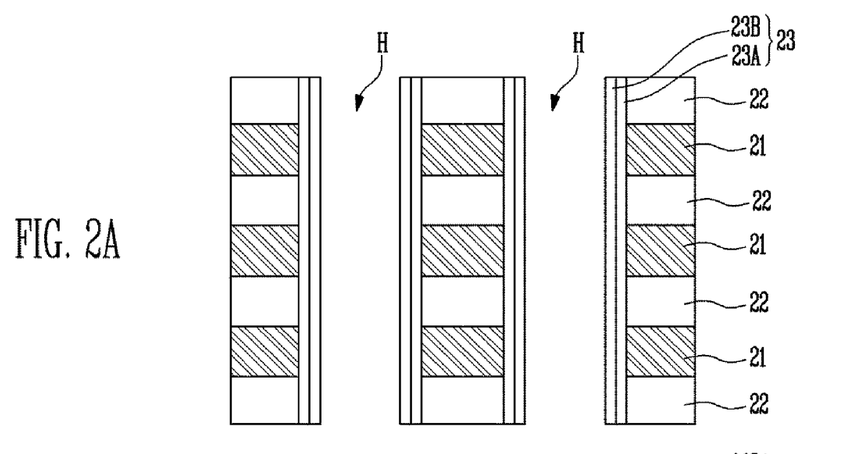
FIGS. 2A to 2E are cross-sectional views illustrating a process flow for a method of manufacturing a semiconductor device according to an embodiment of the present invention.

As illustrated in FIG. 2A, a plurality of first material layers 21 and a plurality of second material layers 22 may be formed alternately with each other. The first material layers 21 may have a high etch selectivity with respect to the second material layers 22. For example, each of the first material layers 21 may include a sacrificial layer such as a nitride layer, and each of the second material layers 22 may include an insulating layer such as an oxide layer. Alternatively, the first material layer 21 may include a first sacrificial layer, and the second material layer 22 may include a second sacrificial layer. A description will be made with reference in which each of the first material layers 21 may include a sacrificial layer and each of the second material layers 22 may include an insulating layer.

Subsequently, a plurality of holes H may be formed through the first and second material layers 21 and 22. The holes H may be arranged in a matrix format at regular intervals or be offset relative to each other.

Subsequently, sacrificial layers 23 may be formed in the holes H. Each of the sacrificial layers 23 may include a dielectric layer and may not be thick enough to completely fill the hole H. For example, after first dielectric layer 23A are formed in the holes H, second dielectric layer 23B may be formed on the first dielectric layer 23A. Each of the first dielectric layers 23A may include an oxide layer, and each of the second dielectric layer 23B may include a nitride layer.

In addition, the first dielectric layer 23A and the second dielectric layer 23B may have the same or different thicknesses. For example, considering the amount of the second dielectric layer 23B to be oxidized, the second dielectric layer 23B may have a greater thickness than the first dielectric layer 23A.

Figure 2B:
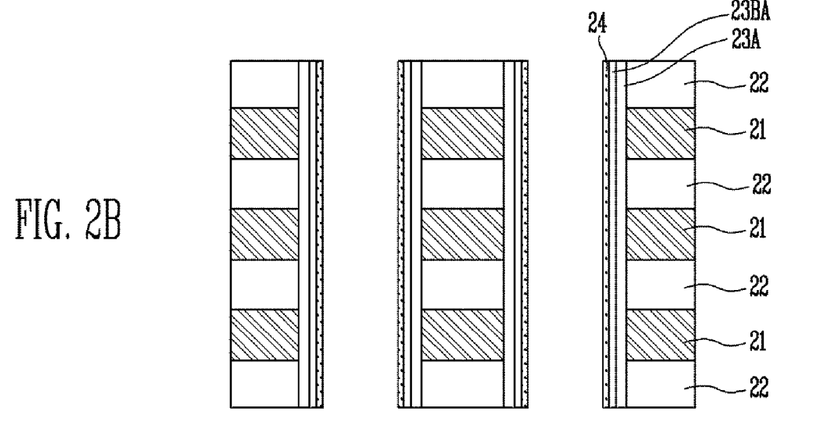

As illustrated in FIG. 2B, first surfaces of the sacrificial layers 23 exposed through the holes H may be oxidized to a predetermined thickness to form first charge blocking layers 24. For example, each of the second dielectric layers 23B may be oxidized to the predetermined thickness to form each of the first charge blocking layers 24. In FIG. 2B, the remaining portions of the second dielectric layers 23 are denoted by 23BA.

Figure 2C:
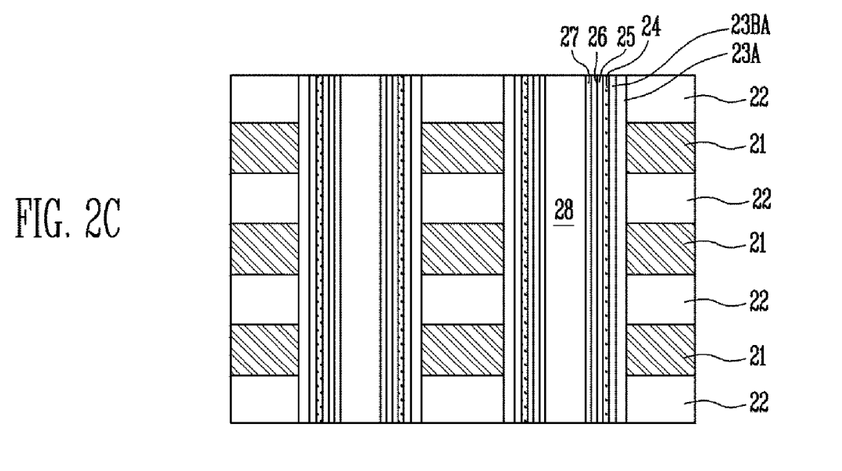

As illustrated in FIG. 2C, a data storage layer 25, a tunnel insulating layer 26 and a channel layer 27 may be sequentially formed on each of the first charge blocking layers 24. The data storage layer 25 may include at least one of a floating gate, such as a polysilicon layer, which can store charge, a charge trap layer, such as a nitride layer, which can trap charge, and nanodots. In addition, the channel layer 27 may be formed in a tubular shape manner having an open central portion, in a pillar shape manner having a central portion completely filled, or a combination thereof. When the channel layer 27 is formed in the tubular shape, the open central portion of the tubular shape may be filled with an insulating layer 28.

For reference, when the semiconductor device is a resistive memory device, a channel layer and a phase-change material layer may be sequentially formed on the first charge blocking layer 24. The first charge blocking layer 24 may function as a gate insulating layer of a memory cell. The phase-change material layer may be formed in a tubular shape manner having an open central portion, in a pillar shape manner having a central portion completely filled, or a combination thereof. When the phase-change material layer is formed in the tubular shape, the open central portion of the tubular shape may be filled with an insulating layer.

Figure 2D:
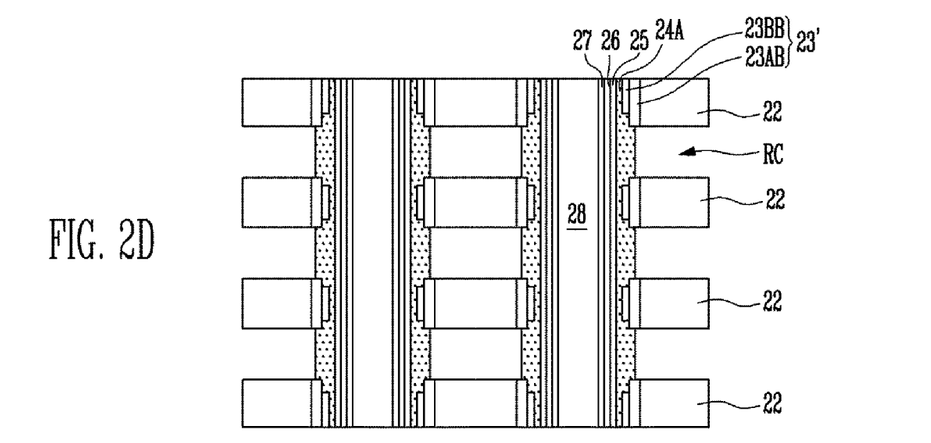

As illustrated in FIG. 2D, a plurality of recessed regions RC may be formed by removing the first material layers 21. For example, after at least one slit (not illustrated) may be formed through the first and second material layers 21 and 22, the first material layers 21 exposed through the slit may be removed.

Subsequently, second surfaces of each of the sacrificial layers 23 exposed through the recessed regions RC may be oxidized. For example, the second dielectric layers 23BA may be exposed by etching the first dielectric layers 23A, and the exposed second dielectric layers 23BA may be oxidized. Oxide layers formed by oxidizing the second dielectric layers 23BA may be coupled to the first charge blocking layers 24. Therefore, the thickness of first regions of each of the first charge blocking layers 24 may be selectively increased by performing an oxidation process, so that final first charge blocking layers 24A may be formed in which the thickness of first regions of the first charge blocking layers 24A may be greater than that of second regions thereof.

After the oxidation process is performed, sacrificial patterns 23' may remain between the first charge blocking layers 24A and the second material layers 22. For example, first dielectric patterns 23AB and second dielectric patterns 23BB may remain. Each of the first dielectric patterns 23AB may have a greater width than each of the second dielectric patterns 23BB. For example, during the oxidation process, the second dielectric layers 23BA may be oxidized to a width greater than that of the sacrificial layer 23 exposed through the recessed regions RC. Each of the first dielectric patterns 23AB may have a greater width than each of the second dielectric patterns 23BB.

Figure 2E:
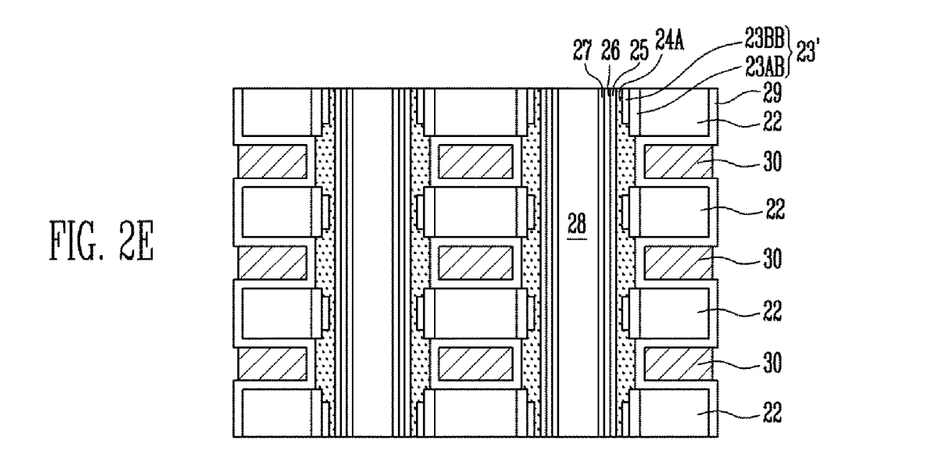

As illustrated in FIG. 2E, a plurality of conductive layers 30 may be formed in the recessed regions RC. For example, conductive layers may be deposited through the slit to fill the recessed regions RC, and the conductive layers formed in the slit may then be removed. As a result, the conductive layers 30 formed in the recessed regions RC may be separated from each other.

For reference, before the conductive layers 30 are formed, second charge blocking layers 29 may be additionally formed in the recessed regions RC. The second charge blocking layers 29 may be interposed between the first charge blocking layer 24A and the conductive layers 30 and between the conductive layers 30 and insulating layers.

Figure 3A:
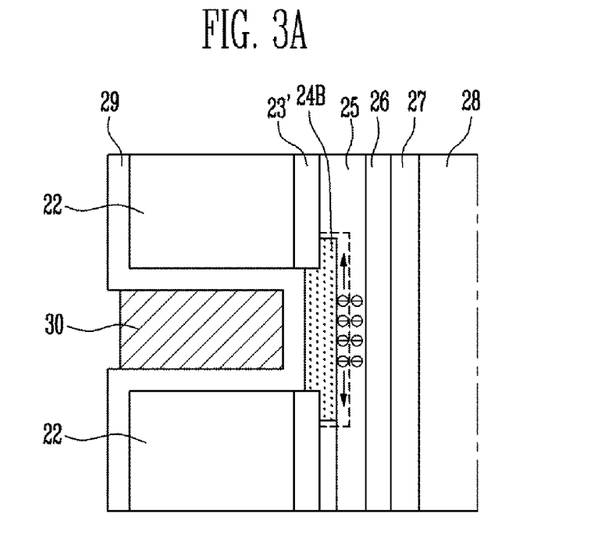
FIGS. 3A and 3B are enlarged views of a region corresponding to a single memory cell.
Figure 3B:
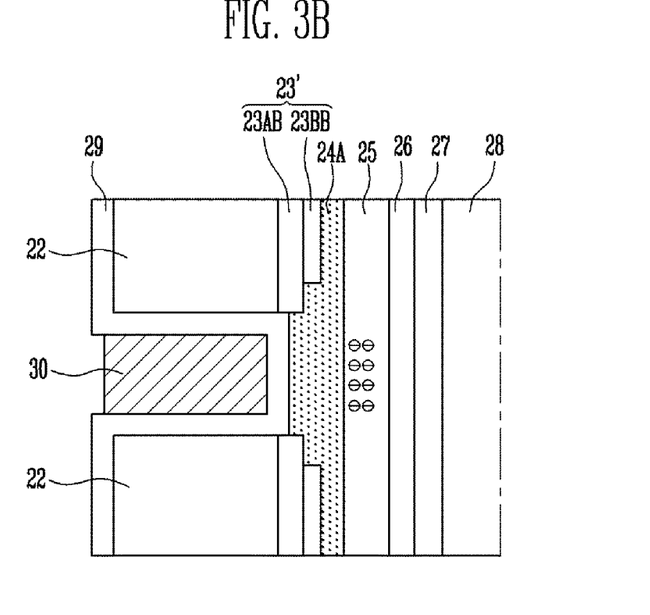

FIGS. 3A and 3B are views illustrating the effects obtained by forming the first charge blocking layers 24A according to an embodiment of the present invention. For illustration purposes, an area corresponding to a single memory cell is enlarged in FIGS. 3A and 3B.

FIG. 3A illustrates an example in which the first charge blocking layer 24B is formed by oxidizing the data storage layer 25 exposed through the recessed regions RC. The first charge blocking layer 24B may be formed only between the data storage layer 25 and the conductive layer 30, and the first charge blocking layer 24B may not be formed between the data storage layer 25 and the second material layer 22.

In addition, when the data storage layer 25 is oxidized, a portion of the data storage layer 25 contacting the first charge blocking layer 24B may contain impurities (e.g., oxygen atoms). A transition region (indicated by dotted lines) may be formed around the first charge blocking layer 24B. The transition region may extend out of a memory cell region. Since shallow level trap sites are likely to be present in the transition region, charges in the data storage layer 25 may move along the transition region as indicated by the arrow. Therefore, the charges stored in the data storage layer 25 may be damaged.

FIG. 3B illustrates wherein the first charge blocking layer 24A may be formed by oxidizing the first and second surfaces of the sacrificial layer 23. When the first charge blocking layer 24A is formed by oxidizing the sacrificial layer 23 instead of the data storage layer 25, the data storage layer 25 may not contain any impurities. In addition, since the transition region is unlikely to be formed around the first charge blocking layer 24A, data retention characteristics may be improved.

Figure 4:
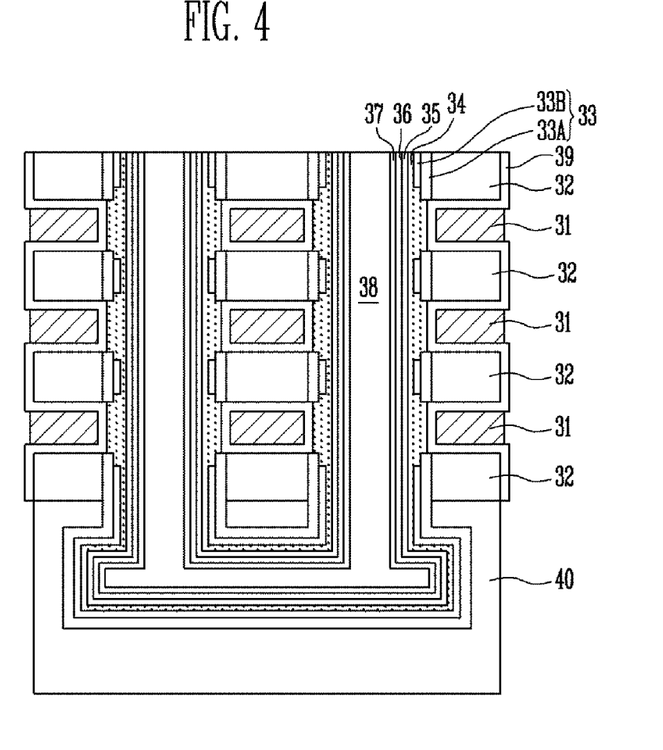
FIG. 4 is a cross-sectional view of the structure of a semiconductor device according to an embodiment of the present invention.

FIG. 4 is a cross-sectional view of the structure of a semiconductor device according to an embodiment of the present invention. Hereinafter, a description of common contents with the earlier described various embodiments is omitted.

As illustrated in FIG. 4, the semiconductor device according to an embodiment may include at least one pipe gate 40, a plurality of conductive layers 31, a plurality of insulating layers 32, at least one channel layer 37, at least one tunnel insulating layer 36, at least one data storage layer 35, at least one charge blocking layer 34 and sacrificial patterns 33.

The plurality of conductive layers 31 and the plurality of insulating layers 32 may be formed alternately with each other on the pipe gate 40. The conductive layers 31 may have the same or different thicknesses. At least one uppermost conductive layer 31 may be a selection gate, and the rest of the conductive layers 31 may be word lines.

The channel layer 37 may include at least two cell channel layers and a pipe channel layer. The pipe channel layer may functions as a connection pattern that connects the cell channel layers. The pipe channel layers may be formed in the pipe gate 40. The cell channel layers may be formed through the plurality of conductive layers 31 and the plurality of insulating layers 32. In addition, when the channel layer 37 has a tubular shape, an insulating layer 38 may be formed in the channel layer 37.

The tunnel insulating layer 36 may include a first tunnel insulating layer surrounding the cell channel layers and a second tunnel insulating layer surrounding the pipe channel layer. The data storage layer 35 may include a first data storage layer surrounding the first tunnel insulating layer and a second data storage layer surrounding the second tunnel insulating layer. In addition, the charge blocking layer 34 may include a first charge blocking layer surrounding the first data storage layer and a second charge blocking layer surrounding the second data storage layer.

The first tunnel insulating layer and the second tunnel insulating layer may be connected in a single layer, the first data storage layer and the second data storage layer may be connected in a single layer, and the first charge blocking layer and the second charge blocking layer may be connected in a single layer.

The sacrificial patterns 33 may include first sacrificial patterns surrounding second regions of the first charge blocking layer and a second sacrificial pattern surrounding the second charge blocking layer. In addition, each of the sacrificial patterns 33 may include a first dielectric pattern 33A and a second dielectric pattern 33B.

In addition, the semiconductor device may further include at least one third charge blocking layer 39 interposed between the first charge blocking layer and the conductive layers 31.

According to the above-described structure of the semiconductor device, the second tunnel insulating layer, the second data storage layer surrounding the pipe channel layer, the second charge blocking layer and the second sacrificial pattern may form a gate insulating layer of a pipe transistor. Therefore, the thickness of the gate insulating layer may be sufficiently increased to thereby prevent a variation in a threshold voltage of the pipe transistor.

Figure 5:
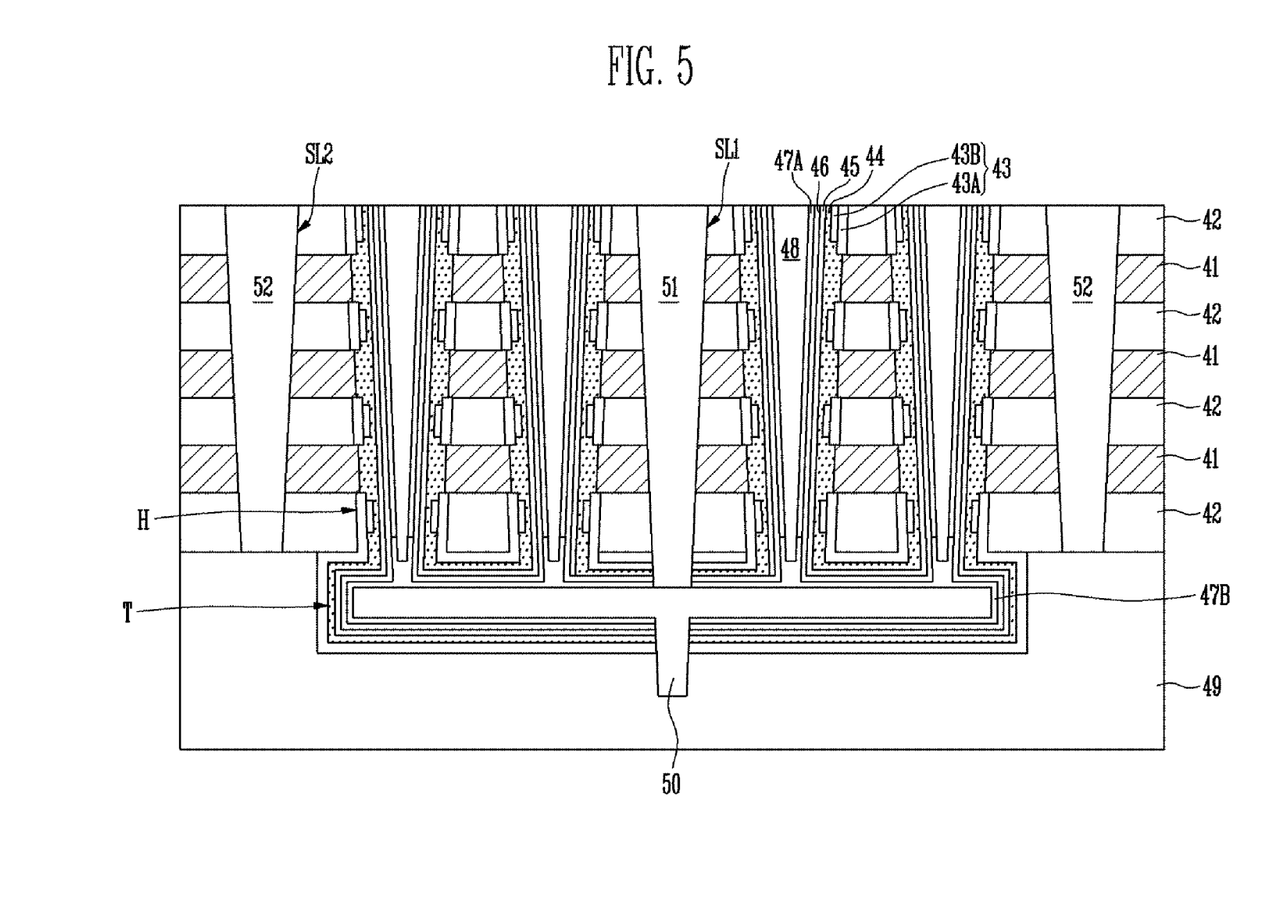
FIG. 5 is a cross-sectional view of the structure of a semiconductor device according to an embodiment of the present invention.

FIG. 5 is a cross-sectional view of the structure of a semiconductor device according to an embodiment of the present invention. Hereinafter, a description of common contents with the earlier described various embodiments is omitted.

As illustrated in FIG. 5, the semiconductor device according to an embodiment of the present invention may include at least one first source layer 49, at least one second source layer 47B, at least one third source layer 50, a plurality of conductive layers 41, a plurality of insulating layers 42, and an insulating layer 48 formed in at least one channel layer 47A, Further, an embodiment may further include at least one tunnel insulating layer 46, at least one data storage layer 45, at least one charge blocking layer 44 and a plurality of sacrificial patterns 43. In addition, the semiconductor device may further include at least one first slit SL1, at least one second slit SL2, an insulating layer 51 in the first slit SL1 and an insulating layer 52 in the second slit SL2.

Each of the first and second source layers 49 and 47B may include a doped polysilicon layer, and the third source layer 50 may include a metal layer such as a tungsten layer. The first source layer 49 may include at least one trench T, and the third source layer 50 may be formed in the trench T. In addition, the second source layer 47B may be formed on an inner surface of the trench T. The second source layer 47B may be interposed between the first source layer 49 and the third source layer 50 and surround the third source layer 50. The third source layer 50 may pass through the second source layer 47B and contact the first source layer 49.

The channel layer 47A in the hole H may protrude from the second source layer 47B and pass through the conductive layers 41 and the insulating layers 42. The channel layer 47A may be coupled integrally with the second source layer 47B. For example, the second source layer 47B may function as a connection pattern that connects bottoms of the channel layers.

The first slit SL1 may pass through the conductive layers 41, the insulating layers 42 and the trench T and extend to a depth within the first source layer 49. The third source layer 50 may be formed in a lower part of the first slit SL1, and the insulating layer 51 may be formed in the remaining part of the first slit SL1.

The second slit SL2 may be deep enough to pass through the conductive layers 41 and the insulating layers 42. The insulating layer 52 may be formed in the second slit SL2.

The tunnel insulating layer 46 may include a first tunnel insulating layer surrounding the channel layers 47A and a second tunnel insulating layer surrounding the second source layer 47B. The data storage layer 45 may include a first data storage layer surrounding the first tunnel insulating layer and a second data storage layer surrounding the second tunnel insulating layer. In addition, the charge blocking layer 44 may include a first charge blocking layer surrounding the first data storage layer and a second charge blocking layer surrounding the second data storage layer.

The sacrificial patterns 43 may include first sacrificial patterns surrounding second regions of the first charge blocking layer and a second sacrificial pattern surrounding the second charge blocking layer. In addition, each of the sacrificial patterns 43 may include a first dielectric pattern 43A and a second dielectric pattern 43B.

Figure 6:
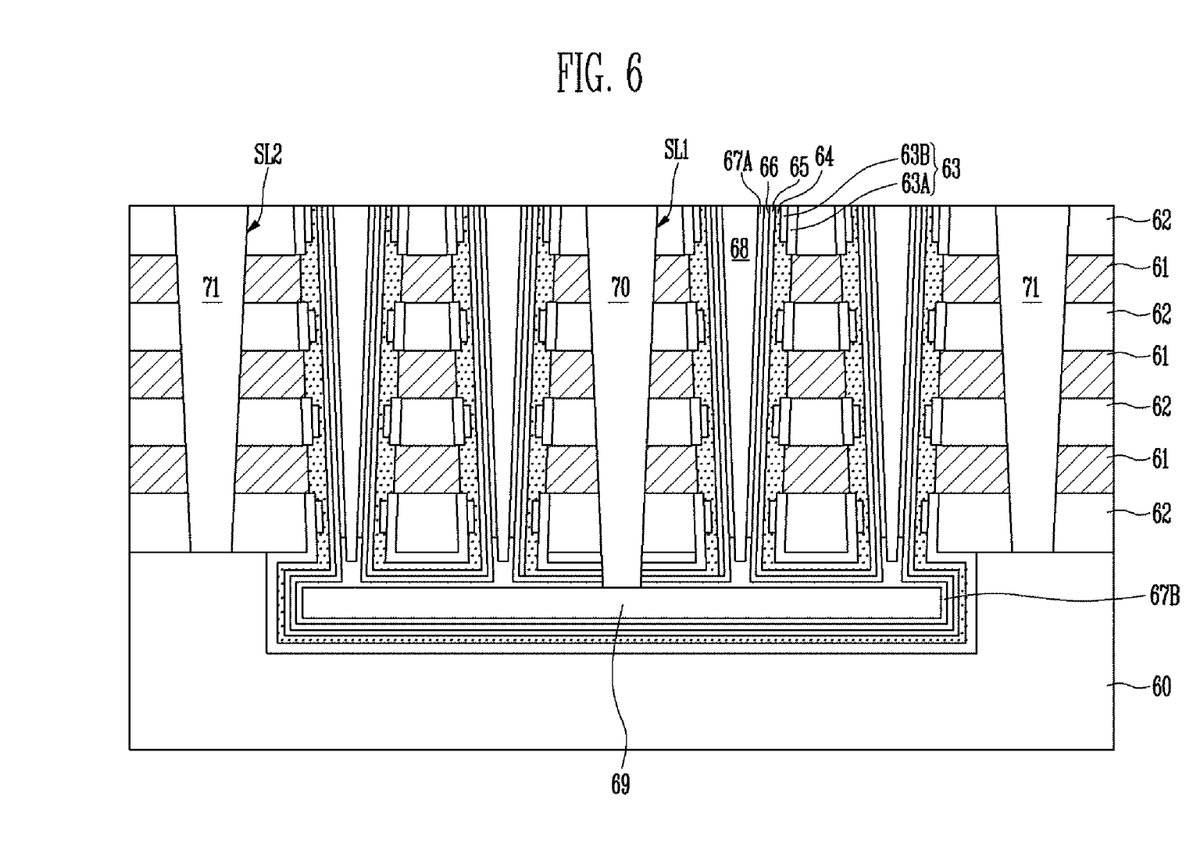
FIG. 6 is a cross-sectional view of the structure of a semiconductor device according to an embodiment of the present invention.

FIG. 6 is a cross-sectional view of the structure of a semiconductor device according to an embodiment of the present invention. Hereinafter, a description of common contents with the earlier described various embodiments is omitted.

As illustrated in FIG. 6, the semiconductor device according to an embodiment may include an interlayer insulating layer 60, at least one first source layer 67B, at least one second source layer 69, a plurality of conductive layers 61, a plurality of insulating layers 62, an insulating layer 68, at least one channel layer 67A, at least one tunnel insulating layer 66, at least one data storage layer 65, at least one charge blocking layer 64 and a plurality of sacrificial patterns 63.

The first source layer 67B may be formed in the interlayer insulating layer 60, and the second source layer 69 may be formed in the first source layer 67B. The channel layer 67A may protrude from the first source layer 67B and pass through the conductive layers 61 and the insulating layers 62. In addition, each of the sacrificial patterns 63 may include a first dielectric pattern 63A and a second dielectric pattern 63B.

In addition, the semiconductor device may further include at least one first slit SL1, at least one second slit SL2, an insulating layer 70 in the first slit SL1 and an insulating layer 71 in the second slit SL2.

For reference, the second source layer 69 may pass through the first source layer 67B and extend into the interlayer insulating layer 60.

Figure 7:
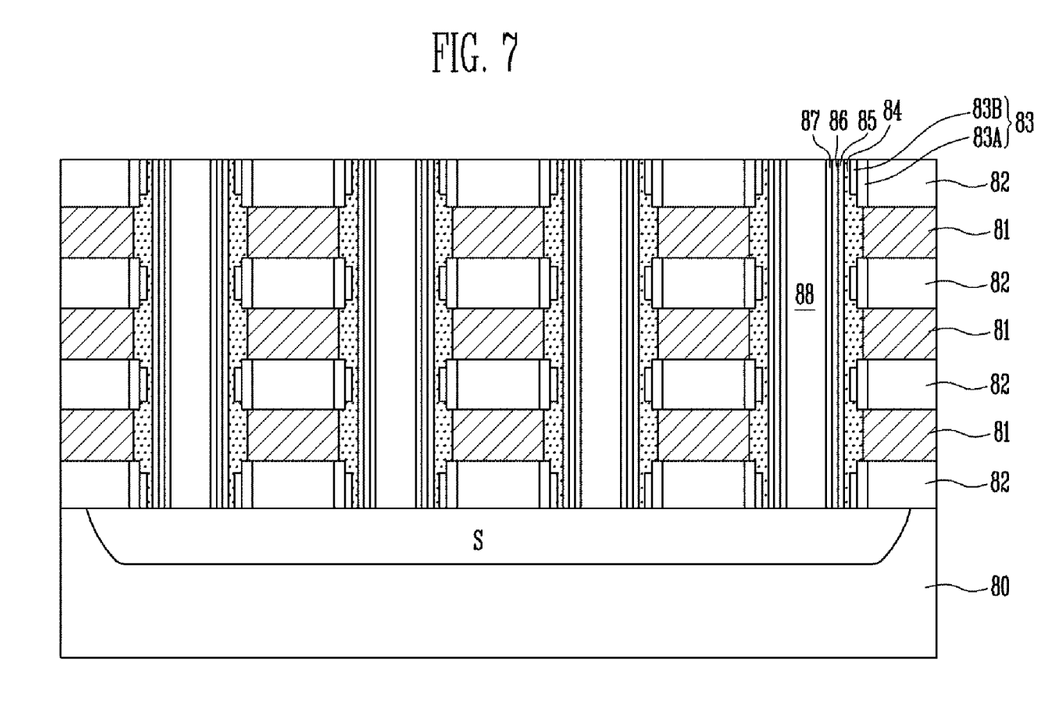
FIG. 7 is a cross-sectional view of the structure of a semiconductor device according to an embodiment of the present invention.

FIG. 7 is a cross-sectional view of the structure of a semiconductor device according to an embodiment of the present invention. Hereinafter, a description of common contents with earlier described various embodiments is omitted.

As illustrated in FIG. 7, the semiconductor device according to an embodiment may include a substrate 80, a plurality of conductive layers 81, a plurality of insulating layers 82, one or more channel layers 87, at least one more tunnel insulating layer 86, at least one data storage layer 85, at least one more charge blocking layer 84 and a plurality of sacrificial patterns 83.

The conductive layers 81 and the insulating layers 82 may be formed alternately with each other on the substrate 80 that includes a source region S. At least one uppermost conductive layer 81 may be an upper selection gate, at least one lowermost conductive layer 81 may be a lower selection gate, and the rest of the conductive layers 81 may be word lines.

The channel layers 87 may protrude from the substrate 80 and pass through the conductive layers 81 and the insulating layers 82. In addition, when each of the channel layers 87 is formed in a tubular shape manner, an insulating layer 88 may be formed in the channel layer 87.

Each of the sacrificial patterns 83 may include a first dielectric pattern 83A and a second dielectric pattern 83B.

Figure 8:
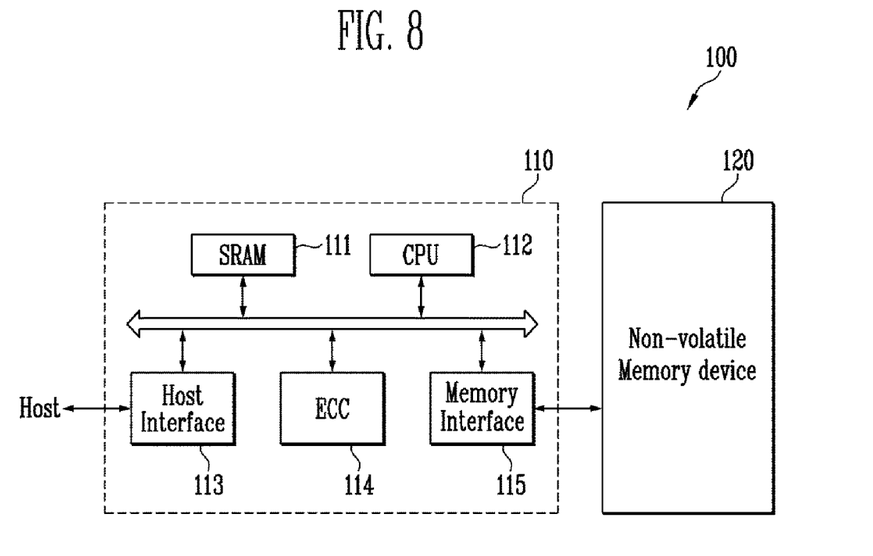
FIG. 8 is a block diagram illustrating the configuration of a memory system according to an embodiment of the present invention.

FIG. 8 is a block diagram illustrating the configuration of a memory system according to an embodiment of the present invention.

As illustrated in FIG. 8, a memory system 100 according to an embodiment of the present invention may include a non-volatile memory device 120 and a memory controller 110.

The non-volatile memory device 120 may have the above-described structure. In addition, the non-volatile memory device 120 may be a multi-chip package composed of a plurality of flash memory chips.

The memory controller 110 may be configured to control the non-volatile memory device 120. The memory controller 110 may include a static random-access memory (SRAM) 111, a central processing unit (CPU) 112, a host interface 113, an error correction code circuit (ECC) 114 and a memory interface 115. The SRAM 111 may function as an operation memory of the CPU 112. The CPU 112 may perform the general control operation for data exchange of the memory controller 110. The host interface 113 may include a data exchange protocol of a host being coupled to the memory system 100. In addition, the ECC 114 may detect and correct errors included in a data read from the non-volatile memory device 120. The memory interface 115 may interface with the non-volatile memory device 120. The memory controller 110 may further include read-only memory (ROM) that may store code data to interface with the host.

The memory system 100 having the above-described configuration may be a solid state disk (SSD) or a memory card in which the memory device 120 and the memory controller 110 are combined. For example, when the memory system 100 is an SSD, the memory controller 110 may communicate with an external device (e.g., a host) through one of the interface protocols including USB, MMC, PCI-E, SATA, PATA, SCSI, ESDI and IDE.

Figure 9:
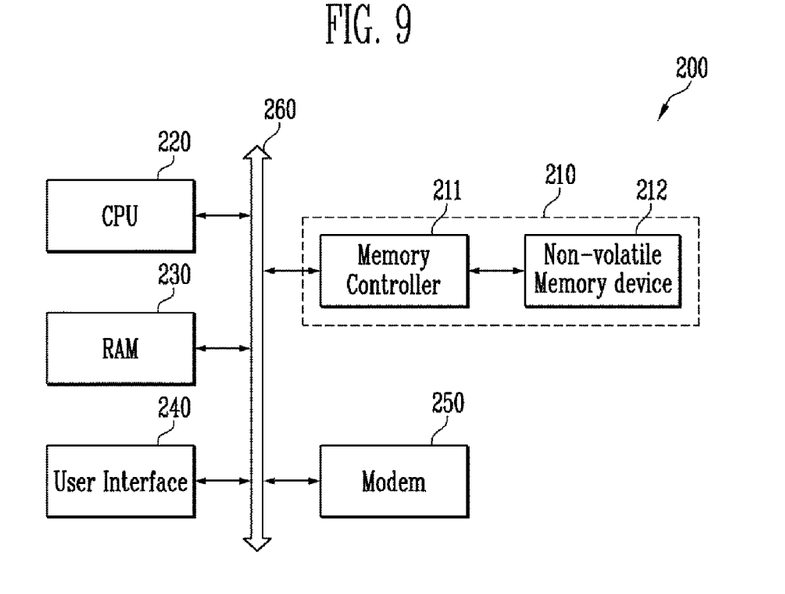
FIG. 9 is a block diagram illustrating the configuration of a computing system according to an embodiment of the present invention.

FIG. 9 is a block diagram illustrating the configuration of a computing system according to an embodiment of the present invention.

As illustrated in FIG. 9, a computing system 200 according to an embodiment of the present invention may include a CPU 220, RAM 230, a user interface or output device 240, a modem or input device 250 and a memory system 210 that are connected to a system bus 260. In addition, when the computing system 200 is a mobile device, a battery may be further included to apply operating voltage to the computing system 200. The computing system 200 may further include application chipsets, a CMOS Image Sensor (CIS) and mobile DRAM.

As described above with reference to FIG. 8, the memory system 210 may include a non-volatile memory 212 and a memory controller 211.

According to the present invention, the thickness of word lines may be increased without increasing the overall height of a stacked structure. Therefore, the resistance of the word lines may be reduced so that characteristics of a memory device may be improved. Since a gate insulating layer of a pipe transistor has a sufficient thickness, a variation in a threshold voltage of the pipe transistor may be prevented. In addition, when a charge blocking layer is formed, oxidation of the data storage layer may be minimized so that data retention characteristics may be improved.

Various embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A method of manufacturing a semiconductor device, the method comprising:
   forming first material layers and second material layers alternately with each other;
   forming at least one hole passing through the first and second material layers;
   forming a sacrificial layer in the at least one hole;
   oxidizing a first surface of the sacrificial layer exposed through the hole to a predetermined thickness;
   forming recessed regions by removing the first material layers; and
   oxidizing a second surface of the sacrificial layer exposed through the recessed regions.

2. The method of claim 1, wherein the forming of the sacrificial layer includes:
   forming a first dielectric layer in the hole; and
   forming the second dielectric layers on the first dielectric layer.

3. The method of claim 2, wherein the oxidizing the first surface of the sacrificial layer includes oxidizing the second dielectric layer to the predetermined thickness.

4. The method of claim 3, wherein the oxidizing of the second surface of the sacrificial layer includes:
   etching the first dielectric layer to expose the second dielectric layer; and
   oxidizing the exposed second dielectric layer.

5. The method of claim 4, wherein a first charge blocking layer is formed by oxidizing the second dielectric layer exposed on the first surface of the sacrificial layer, and a second charge blocking layer is formed by oxidizing the second dielectric layer exposed on the second surface of the sacrificial layer.

6. The method of claim 5, wherein the first charge blocking layer and the second charge blocking layer are connected in a single layer.

7. The method of claim 2, wherein the first dielectric layer includes an oxide layer and the second dielectric layer includes a nitride layer.

8. The method of claim 2, wherein the first dielectric layer and the second dielectric layer have a substantially same thickness.

9. The method of claim 2, wherein the second dielectric layer has a greater thickness than the first dielectric layer.

10. The method of claim 1, further comprising:
    sequentially forming a data storage layer, a tunnel insulating layer and a channel layer after oxidizing the first surface of the sacrificial layer.

11. The method of claim 1, further comprising:
    forming conductive layers in the recessed regions after oxidizing the second surface of the sacrificial layer.

* * * * *